(12) United States Patent
Vaz (10) Patent No.: US 10,256,802 B1
(45) Date of Patent: Apr. 9, 2019

(54) OVERVOLTAGE PROTECTION CIRCUIT

(71) Applicant: Xilinx, Inc., San Jose, CA (US)

(72) Inventor: Bruno Miguel Vaz, Sao Domingos de Rana (PT)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/616,872

(22) Filed: Jun. 7, 2017

(51) Int. Cl.
*H03K 17/0812* (2006.01)
*H03M 1/12* (2006.01)
*G01R 19/165* (2006.01)

(52) U.S. Cl.
CPC ..... *H03K 17/08122* (2013.01); *G01R 19/165* (2013.01); *H03M 1/12* (2013.01)

(58) Field of Classification Search
CPC .. H03K 17/08122; G01R 19/165; H03M 1/12
USPC .... 327/108–112, 427, 434, 437; 326/82, 83, 326/87
See application file for complete search history.

(56) References Cited

U.S. PATENT DOCUMENTS

| | | | | |
|---|---|---|---|---|
| 6,255,850 B1* | 7/2001 | Turner | ............. | H03K 19/00315 326/121 |
| 6,265,926 B1* | 7/2001 | Wong | ............... | H03K 19/00315 326/81 |
| 6,426,804 B1* | 7/2002 | Kanno | ............... | H04N 1/00933 358/1.1 |
| 7,809,864 B1* | 10/2010 | Young | ..................... | G06F 1/266 326/83 |
| 7,821,682 B2* | 10/2010 | Nakazawa | ............. | H04N 5/335 348/207.99 |
| 8,610,045 B2* | 12/2013 | Konno | ................... | H04N 1/193 250/214 R |
| 2010/0201283 A1* | 8/2010 | Kawata | ..................... | G05F 3/08 315/287 |
| 2012/0092732 A1* | 4/2012 | Nakazawa | ......... | H04N 1/00928 358/474 |

OTHER PUBLICATIONS

Jayamohan, Umesh, AnalogDialogue, "RF-Sampling ADC Input Protection: Not Black Magic After All", Apr. 2015, vol. 49, 15 pages, http://www.analog.com/en/analog-dialogue/articles/rf-samp-adc-input-protection.html.

* cited by examiner

*Primary Examiner* — Thomas Skibinski
(74) *Attorney, Agent, or Firm* — Robert M. Brush (57) ABSTRACT

In an example, an input buffer includes: first buffer circuit having an output, a first voltage control node, and a second voltage control node; a first transistor having a gate coupled to the output of the first buffer circuit, a drain, and a source; a second buffer circuit having an input coupled to a reference voltage and an output coupled to the source of the first transistor; and a first current source having a reference output coupled to the drain of the first transistor, a first output coupled to the first voltage control node of the first buffer circuit, and a second output coupled to the second voltage control node of the second buffer circuit.

20 Claims, 6 Drawing Sheets

OVERVOLTAGE PROTECTION CIRCUIT

TECHNICAL FIELD

Examples of the present disclosure generally relate to electronic circuits and, in particular, to an overvoltage protection circuit.

BACKGROUND

There is an increasing demand for very high-speed analog-to-digital converters (ADCs) in wireless communication systems. Such high-speed ADCs require the use of core thin-oxide devices in nanometer-scale technologies to achieve the desired sampling frequencies. The core thin-oxide devices are sensitive to overvoltage. Typically, the ADCs are interfaced with external low noise amplifiers (LNAs) or radio frequency (RF) variable gain amplifiers (VGAs). The LNAs/RF VGAs supply signals that can exceed the reliability limits of the ADC, resulting in potential damage to the core thin-oxide devices.

One technique to protect against overvoltage is to use external Schottky diodes to prevent the voltage from rising about the reliability levels. Those additional devices, however, reduce the maximum achievable bandwidth, introduce distortion, and increase the bill-of-materials (BOM) and other associated costs. It is therefore desirable to provide overvoltage protection without the use of such external devices.

SUMMARY

Techniques for overvoltage protection are described. In an example, an input buffer includes: first buffer circuit having an output, a first voltage control node, and a second voltage control node; a first transistor having a gate coupled to the output of the first buffer circuit, a drain, and a source; a second buffer circuit having an input coupled to a reference voltage and an output coupled to the source of the first transistor; and a first current source having a reference output coupled to the drain of the first transistor, a first output coupled to the first voltage control node of the first buffer circuit, and a second output coupled to the second voltage control node of the second buffer circuit.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Figure 1:
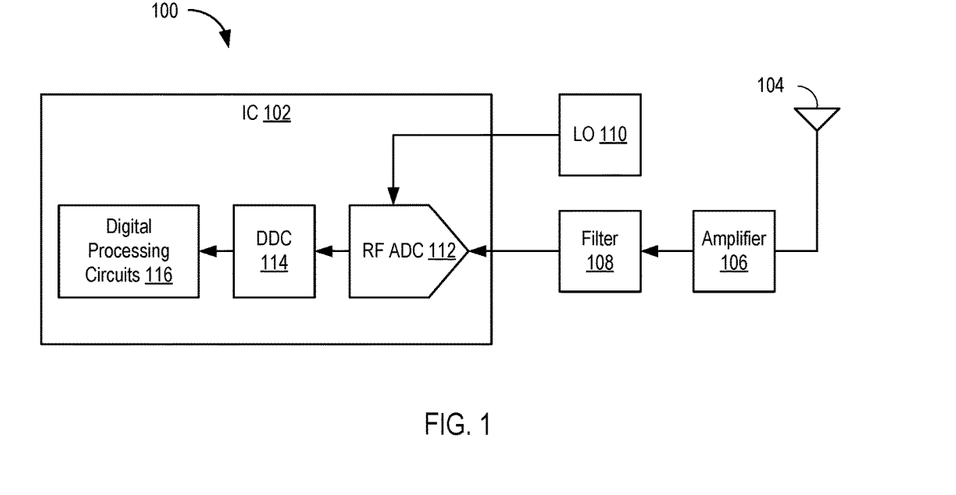
FIG. 1 is a block diagram depicting a radio frequency (RF) receiver in which examples of the overvoltage protection techniques described herein can be used.

FIG. 1 is a block diagram depicting a radio frequency (RF) receiver 100 in which examples of the overvoltage protection techniques described herein can be used. The RF receiver 100 includes an antenna 104, an amplifier 106, a filter 108, a local oscillator (LO) 110, and an integrated circuit (IC) 102. The IC 102 includes an RF analog-to-digital converter (ADC) 112, a digital down-converter (DDC) 114, and digital processing circuits 116. An input of the amplifier 106 is coupled to the antenna 104. An output of the amplifier 106 is coupled to an input of the filter 108. An output of the filter 108 is coupled to a first input of the RF ADC 112. An output of the LO 110 is coupled to a second input of the RF ADC 112. An output of the RF ADC 112 is coupled to an input of the DDC 114. An output of the DDC 114 is coupled to an input of the digital processing circuits 116.

In operation, the amplifier 106 increases gain of an RF signal received by the antenna 104. The amplifier 106 can be a low-noise amplifier (LNA), variable gain amplifier (VGA), or the like. The filter 108 filters the received RF signal (e.g., a bandpass filter). The LO 110 generates a clock signal for use by the RF ADC 112 is sampling the RF signal supplied by the filter 108. The RF ADC 112 samples the RF signal and generates a digital signal as output. The DDC 114 down-converts the digital signal to an intermediate or baseband frequency. The digital processing circuits 116 perform equalization, filtering, and the like to recover baseband data. The RF ADC 112 can include overvoltage protection circuits to protect sensitive devices therein. Examples of an overvoltage protection circuit are described below.

Figure 2:
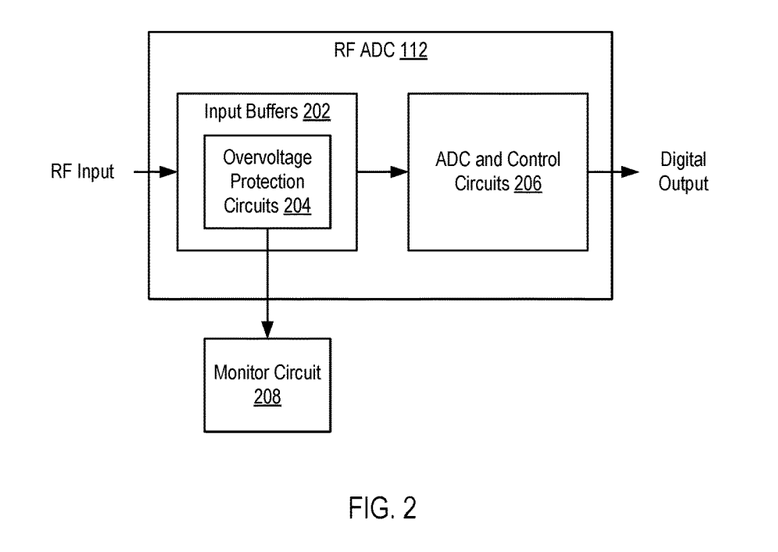
FIG. 2 is a block diagram depicting an RF analog-to-digital converter (ADC) according to an example.

FIG. 2 is a block diagram depicting the RF ADC 112 according to an example. The RF ADC 112 includes input buffers 202 and ADC and control circuits 206. The input buffers 202 have an RF input. The ADC and control circuits 206 have a digital output. The input buffers 202 include overvoltage protection circuits 204. The overvoltage protection circuits 204 can have a digital output that can be supplied to a monitor circuit 208.

In operation, the input buffers 202 receive and buffer the RF input from the ADC and control circuits 206. The overvoltage protection circuits 204 protect the input buffers 202 and the ADC and control circuits 206 from overvoltage supplied at the RF input. The overvoltage protection circuits 204 can generate digital values indicating presence of an overvoltage condition, which can be received by the monitor circuit 208. The overvoltage protection circuits 204 operate by detecting an overvoltage condition at the RF input and clamping voltages in the input buffers 202 so as to not damage sensitive devices in the input buffers 202 and the ADC and control circuits 206, such as thin-oxide metal-oxide field effect transistors (MOSFETs).

Figure 3:
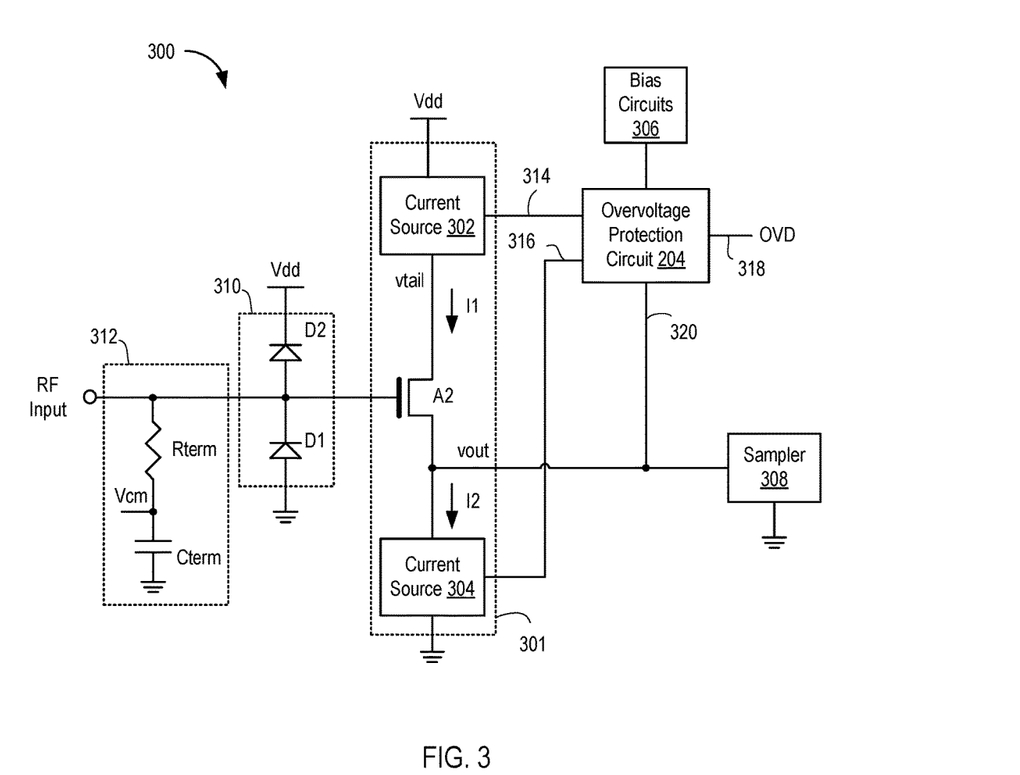
FIG. 3 is a block diagram depicting input circuitry of an ADC according to an example.

FIG. 3 is a block diagram depicting input circuitry 300 of an ADC according to an example. The input circuitry 300 includes an input buffer 301 including a transistor A3, a current source 302, and a current source 304. An input of the buffer 301 is coupled to an electrostatic discharge (ESD) circuit 310 and a termination impedance 312. An output of the buffer 301 is coupled to a sampler 308 of the ADC. The transistor A3 is a field effect transistor (FET), such as an n-channel MOSFET (NMOS transistor).

A gate of the transistor A3 is coupled to receive the RF input signal. The termination impedance 312 includes a resistor Rterm and a capacitor Cterm. The capacitor Cterm provides a DC bias of Vcm to the RF input. The resistor Rterm matches the characteristic impedance of the RF input (e.g., 50 ohms). The ESD circuit 310 includes a diode D1 having a cathode coupled to the RF input and an anode coupled to electrical ground. The ESD circuit 310 also includes a diode D2 having an anode coupled to the RF input and a cathode coupled to a supply voltage Vdd. A drain of the transistor A3 is coupled to an output of the current source 302. The current source 302 is coupled between the supply voltage Vdd and the drain of the transistor A3. A source of the transistor A3 is coupled to an input of the current source 304. The current source 304 is coupled between the source of the transistor A3 and electrical ground. The source of the transistor A3 supplies a voltage vout to the sampler 308.

The current source 302 supplies a current I1 to the drain of the transistor A3. The drain of the transistor A3 has a voltage vtail with respect to electrical ground. The current source 304 sinks a current I2 from the node vout (i.e., the current source 304 supplies a current −I2, where I2>0). When the gate of the transistor A3 is exposed to a high-voltage input (e.g., higher than expected for the design), it can stress the current source 302, the current source 304, and the sampler devices. For example, a high-voltage input can cause excessive drain-to-source voltage ($V_{DS}$) on transistors in the current source 302 and the current source 304. The ESD circuit 310 can absorb some of the high-voltage input, but even the high-voltage input clipped by the ESD circuit 310 can damage transistors in the current sources 302, 304 and the sampler devices. For example, in order to achieve desired performance of the input buffer, transistors in the current sources 302 and 304 can be thin-oxide transistors, which have a specific $V_{DS}$ requirement that must be maintained for reliability.

The overvoltage protection circuit 204 includes an input 320 coupled to receive the output of the buffer 301 (vout). The overvoltage protection circuit 204 further includes outputs 314 and 316 coupled to the current source 302 and 304, respectively. The overvoltage protection circuit 204 detects when vout exceeds a reference voltage, which indicates an overvoltage condition. The overvoltage protection circuit 204 controls the current sources 302 and 304 to clip the vtail and vout voltages to the reference voltage, which is set within the reliability limits of the transistors in the current sources 302 and 304. The overvoltage protection circuit 204 can include an output 318 for providing a digital indicator of an overvoltage condition (OVD). The overvoltage protection circuit 204 receives bias voltages for operation from bias circuits 306. Bias circuits 306 can also provide bias voltages to the current sources 302, 304 (not shown for simplicity). An example of the overvoltage protection circuit 204 coupled to an example buffer circuit is described below.

Figure 4:
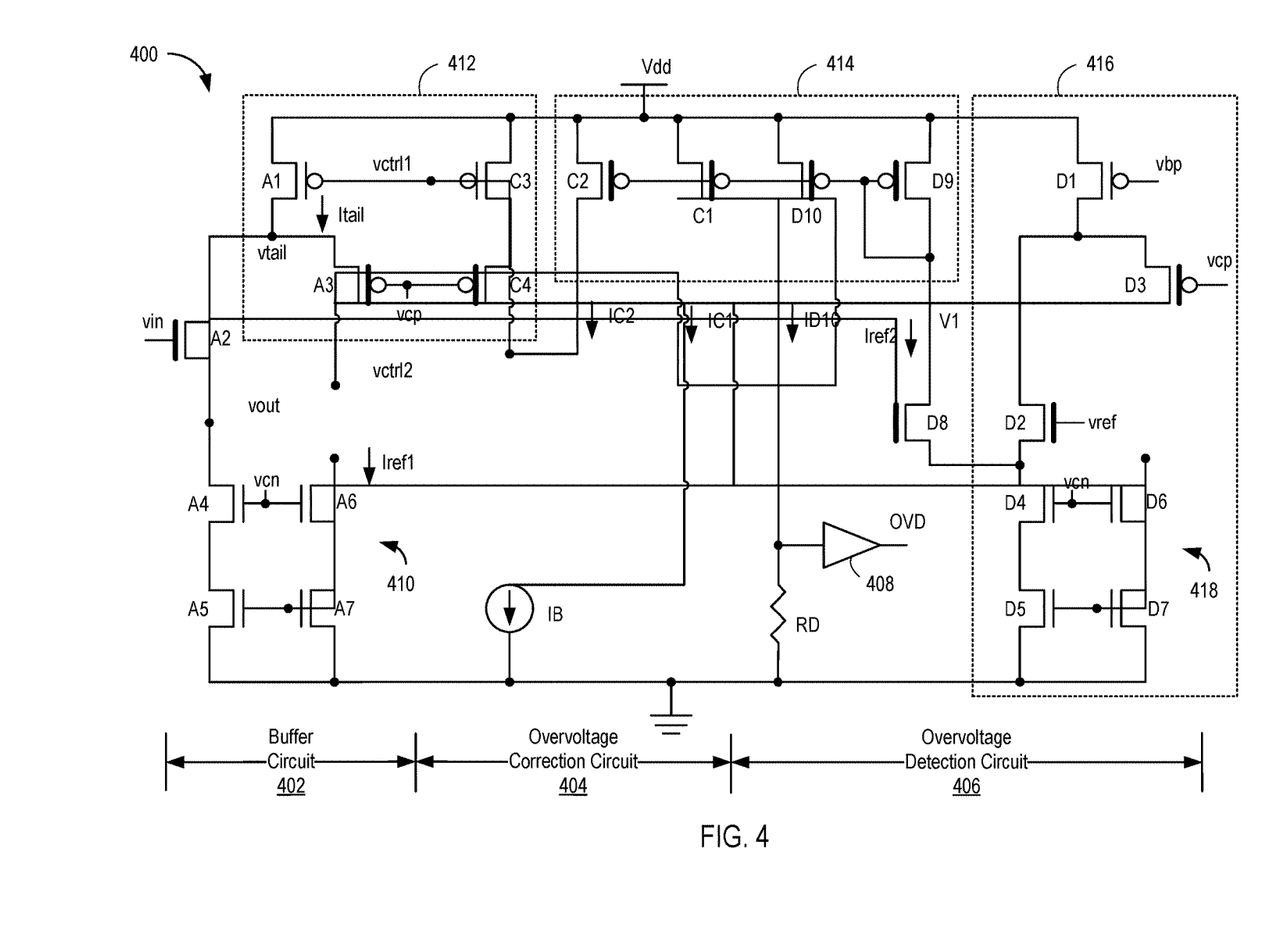
FIG. 4 is a schematic diagram depicting an input buffer according to an embodiment.

FIG. 4 is a schematic diagram depicting an input buffer 400 according to an embodiment. The input buffer 400 can be used in an RF ADC or any other circuit requiring use of an input buffer. Thus, the input buffer 400 is not limited to the application of an RF ADC. The input buffer 400 includes transistors A1 through A7, transistors C1 through C4, transistors D1 through D10, a current source IB, a resistor RD, and a voltage comparator 408. The transistors A2, A4, A5, A6, A7, D2, D4, D5, D6, D7, and D8 are NMOS transistors. The transistors A1, A3, C1, C2, C3, C4, D1, D3, D9, and D10 are p-channel MOSFETs (PMOS transistors). The transistors A1, A4, A5, A6, A7, C3, D1, D4, D5, D6, and D7 are thin-oxide transistors. The transistors A2, A3, C1, C2, C4, D2, D3, D8, D9, and D10 are thick-oxide transistors. In FIG. 4, the thick-oxide transistors are depicted as having lines representing the gates thereof. In an example, the gate-dielectric material of the transistors is silicon dioxide. Alternatively, the gate-dielectric material of the transistors can be a high-K dielectric material. In general, the maximum magnitude of the gate-to-source, gate-to-drain, and drain-to-source voltages for a thin-oxide transistor is less than the maximum magnitude of like voltages for a thick-oxide transistor. For example, the maximum magnitude of such voltages for a thin-oxide transistor can be approximately 1.2 V, whereas the maximum magnitude of such voltages can be approximately 2.3 V for a thick-oxide transistor. Such voltages are examples and can vary depending on the devices and the technology node.

The transistors A1 ... A7 form a buffer circuit 402. A gate of the transistor A2 is coupled to receive the RF input (referred to as vin). A source of the transistor A2 is coupled to a drain of the transistor A4. The source of the transistor A2 is coupled to a node vout. The node vout supplies a voltage vout with respect to electrical ground. A source of the transistor A4 is coupled to a drain of the transistor A5. A source of the transistor A5 is coupled to electrical ground. A drain of the transistor A2 is coupled to a drain of the transistor A1. The drain of the transistor A1 is also coupled to a source of the transistor A3. A node vtail includes the drain of the transistor A2, the drain of the transistor A1, and the source of the transistor A3. The node vtail has a voltage vtail with respect to electrical ground. A drain of the transistor A3 is coupled to a drain of the transistor A6. A source of the transistor A6 is coupled to a drain of the transistor A7. A source of the transistor A7 is coupled to electrical ground. A gate of the transistor A6 is coupled to a gate of the transistor A4. The gates of the transistors A4 and A6 are coupled to a node vcn, which receives a bias voltage vcn. A gate of the transistor A7 is coupled to a gate of the transistor A5. The gates of the transistors A5 and A7 are also coupled to the drain of the transistor A6 and the drain of the transistor A3. A node vctrl2 includes the drain of the transistor A3, the drain of the transistor A6, the gate of the transistor A5, the gate of the transistor A7, and a drain of the transistor C1. The node vctrl2 has a voltage vctrl2 with respect to electrical ground. A source of the transistor A1 is coupled to a node Vdd. The node Vdd supplies a voltage Vdd to the input buffer 400.

A source of the transistor C3 is coupled to the node Vdd. A drain of the transistor C3 is coupled to a source of the transistor C4. A drain of the transistor C4 is coupled to the current source IB. The current source IB is coupled between the drain of the transistor C4 and electrical ground. A gate of the transistor C3 is coupled to a gate of the transistor A1. A gate of the transistor C4 is coupled to a gate of the transistor A3. The gates of the transistors A3 and C4 are coupled to a node vcp, which supplies a bias voltage vcp. A source of the transistor C2 is coupled to the node Vdd. A drain of the transistor C2 is coupled to the drain of the transistor C4. The gates of the transistors A1 and C3 are also coupled to the drain of the transistor C4. A node vctrl1 includes the gate of the transistor A1, the gate of the transistor C3, the drain of the transistor C4, and the drain of the transistor C2. The node vctrl1 has a voltage vctrl1 with respect to electrical ground.

A source of the transistor C1, a source of the transistor D10, and a source of the transistor D9 are each coupled to the node Vdd. The drain of the transistor C1 is coupled to the node vctrl2, as noted above. A drain of the transistor D10 is coupled to the resistor RD. The resistor RD is coupled between the drain of the transistor D10 and electrical ground. The voltage comparator 408 has an input coupled to the drain of the transistor D10. An output of the voltage comparator 408 provides a voltage OVD. A gate of the transistor D9 is coupled to a gate of the transistor D10, a gate of the transistor C1, and a gate of the transistor C2. The gates of the transistors D9, D10, C1, and C2 are each coupled to a drain of the transistor D9. The drain of the transistor D9 is coupled to a drain of the transistor D8. A node V1 includes the gates of the transistors D9, D10, C1, and C2, the drain of the transistor D9, and the drain of the transistor D8. A gate of the transistor D8 is coupled to the node vout.

A source of the transistor D1 is coupled to the node Vdd. A drain of the transistor D1 is coupled a drain of the transistor D2 and a drain of the transistor D3. A source of the transistor D3 is coupled to a drain of the transistor D6. A source of the transistor D6 is coupled to a drain of the transistor D7. The source of the transistor D7 is coupled to electrical ground. A source of the transistor D2 is coupled to a source of the transistor D8 and a drain of the transistor D4. A source of the transistor D4 is coupled to a drain of the transistor D5. A source of the transistor D5 is coupled to electrical ground. A gate of the transistor D4 is coupled to a gate of the transistor D6. A gate of the transistor D5 is coupled to a gate of the transistor D7. The gates of the transistors D5 and D7 are also coupled to the drain of the transistor D3 and the drain of the transistor D6. A gate of the transistor D1 is coupled to a node vbp, which supplies a bias voltage vbp. A gate of the transistor D3 receives a node vcp, which supplies a bias voltage vcp. The gates of the transistors D4 and D6 are coupled to a node vcn, which supplies the bias voltage vcn. A gate of the transistor D2 is coupled to a node vref, which supplies a reference voltage vref.

The voltages vbp, vcp, and vcn are set in such a way to maximize voltage swing while keeping transistors A1, A4, A5, A6, A7, C3, C4, D1, D3, D4, D5, D6, and D7 in saturation.

The transistors A1 . . . A7 implement the buffer circuit 402. The transistors C1 . . . C4 and the current source IB implement an overvoltage correction circuit 404. The transistors D1 . . . D10, the resistor RD, and the voltage comparator 408 implement an overvoltage detection circuit 406. In particular, the transistors A4 . . . A7 implement a current source 410. The transistors C3, C4, A1, and A3 implement a current source 412. The transistors D9, D10, C1, and C2 implement a current source 414. The transistors D1 . . . D7 implement a second buffer circuit 416. The transistors D4 . . . D7 implement a current source 418.

Consider operation of the buffer circuit 402 and assume that the current source 414, the buffer circuit 416, the transistor D8, the resistor RD, and the voltage comparator 408 are not present. The buffer circuit 402 functions as an NMOS source follower with current feedback. The current feedback loop maximizes the linearity of the source follower. Any signal-dependent increase in current drawn by the transistor A2 decreases the current flowing into the source of the transistor A3. This decrease in current is then fed back through the current source 410 (as current Iref1). The current source 410 operates as a current mirror, which can have a ratio 1:4 between the transistor A7 and the transistor A5 (although other ratios can be used).

The buffer circuit 402 uses a combination of thin- and thick-oxide devices to maximize performance and maintain full reliability during start-up, power-down, and normal operation. The voltages vtail and vout should not rise over the reliability limits of the thin-oxide devices, which can be around 1.2 V (for example). In particular, the voltage vtail should be kept higher than Vdd-1.2 V (for example) at all times to protect the transistor A1. In case of an overvoltage on the node vin, the only circuit preventing the rise in voltage is the ESD circuit 310, which can keep vin lower than 2.8 V (for example) considering Vdd of 1.8 V and a 50 ohm impedance source (for example). If no further circuitry is added, vout can rise up to 2 V (for example), which can damage the thin-oxide devices up-stream in the signal chain (e.g., ADC circuits).

Now consider operation of the input buffer 400 as a whole as shown in FIG. 4. As noted above, the $V_{DS}$ of the transistor A1 should be less than 1.2 V (for example) and the voltage vout should be less than 1.2 V (for example) to protect device A4 and up-stream devices in the ADC. The overvoltage detection circuit 406 operates in class B to reduce power dissipation in normal operation and to enable fast and robust detection and correction in the case of overvoltage on vout. Assuming $V_{DS}$ of a thin-oxide device should be kept lower than 1.2 V (for example), then vref can be set to 1.15 V (for example).

When vout is lower than vref, the transistor D8 is fully off and the overvoltage protection circuit does not interfere with the normal operation of the buffer circuit 402. When vout rises over vref, the transistor D8 starts sinking current (referred to as Iref2). The current Iref2 is mirrored by transistors D9 and D10 to generate a current ID10. The resistor RD converts the current ID10 to a voltage, which is input to the voltage comparator 408. The voltage comparator 408 asserts the output in response to detecting a voltage across the resistor RD. The signal OVD indicates the presence of an overvoltage event.

Concurrently, the transistors D9 and C2 function as a current mirror to generate a current IC2. The current IC2 is injected into the node vctrl1. The node vctrl1 functions as a current subtractor, which reduces the current Itail supplied by the transistor A1 proportionally to IB-IC2. That is, the tail current Itail supplied to the buffer 402 is normally proportional to IB. The transistors C3, C4, and A1 mirror the current IB to generate the current Itail. In an overvoltage event, the current IC2 is non-zero, which reduces the current supplied by the transistor C4 and in turn proportionally reduces the mirrored current Itail.

Concurrently, the transistors D9 and C1 function as a current mirror to generate a current IC1. The current IC1 is injected into the node vctrl2. Due to the effect of the current feedback loop in the buffer circuit 402, the voltage vtail drops, which reduces the Vgs of the transistor A3. This reduces the current supplied by the transistor A3. Eventually the transistor A3 switches off (as the source voltage of transistor A3 approaches its gate voltage), which opens the current feedback loop in the buffer circuit 402. When the current feedback loop is open, both vout and vtail settle at a voltage of vref, which guarantees that all transistors have adequate voltage protection during an overvoltage event.

In summary, the input buffer 400 includes a first buffer circuit 402 having an output (vout), a first voltage control node (vctrl1), and a second voltage control node (vctrl2). The input buffer 400 further includes a first transistor (D8) having a gate coupled to the output (vout) of the first buffer circuit 402, a drain, and a source. A second buffer circuit 416 includes an input (vref) coupled to a reference voltage (vref) and an output (source of D2) coupled to the source of the first transistor (D8). A first current source 414 includes a reference output (drain of D9) coupled to the drain of the first transistor (D8), a first output (drain of C2) coupled to the first voltage control node (vctrl1), and a second output (drain of C1) coupled to the second voltage control node (vctrl2).

In an example, the first current source 414 includes a third output (drain of D10). The input buffer 400 further includes a resistor RD coupled between electrical ground and the third output (drain of D10) of the first current source 414. The input buffer 400 further includes a voltage comparator 408 having an input coupled to a node formed by the third output (drain of D10) of the first current source 414 and the resistor RD.

In an example, the reference output (drain of D9) of the first current source 414 supplies a first reference current (Iref2), the first output (drain of C2) supplies a first mirrored current (IC2), and the second output (drain of C1) supplies a second mirrored current (IC1). Each of the first and second mirrored currents (IC2 and IC1) are proportional to the first reference current (Iref2).

In an example, the first buffer circuit 402 includes a second transistor (A2) having a gate providing an input (vin) to the first buffer circuit 402, a source, and a drain. A second current source 412 has a reference output (drain of C4) coupled to a third current source IB, a first output (drain of A1) coupled to the drain of the second transistor (A2), and a second output (drain of A3). A fourth current source 410 includes a reference input (drain of A6) coupled to the second output (drain of A3) of the second current source 412 and an input (drain of A4) coupled to the source of the second transistor (A2). The reference output (drain of C4) of the second current source 412 is common with the first control node (vctrl1) and the second output (drain of A3) of the second current source 412 is common with the second control node (vctrl2).

In an example, the second current source 412 includes a thin-oxide transistor (A1) providing the first output (drain of A1), and the fourth current source 410 includes a plurality of thin-oxide transistors (A4 . . . A7). In an example, the first transistor (D8) comprises a thick-oxide transistor, and the second current source 412 includes thick-oxide transistors (C4, A3) provide the reference output (drain of C4) and the second output (drain of A3), respectively.

In an example, the second buffer circuit 416 includes a second transistor (D2) having a gate coupled to receive the reference voltage (vref), a source providing the output coupled to the source of the first transistor (D8), and a drain. The second buffer circuit 416 further includes a third transistor (D1) having a gate coupled to receive a first bias voltage (vbp), a source coupled to a supply node (Vdd), and a drain. The second buffer circuit 416 further includes a fourth transistor (D3) having a source coupled to the drain of the third transistor (D1), a gate coupled to receive a second bias voltage (vcp), and a drain. The second buffer circuit 416 includes a third current source 418 having a reference input (drain of D6) coupled to the drain of the fourth transistor (D3) and an input (drain of D4) coupled to the drain of the second transistor (D2). In an example, the third transistor (D1) of the second buffer circuit 416 comprises a thin-oxide transistor, and the third current source 418 of the first buffer circuit 416 includes a plurality of thin-oxide transistors (D4 . . . D7).

In the examples described above, the designations "first," "second," "third," and "fourth" are for identification purposes only and do not connote amounts of the modified circuit elements.

Figure 5:
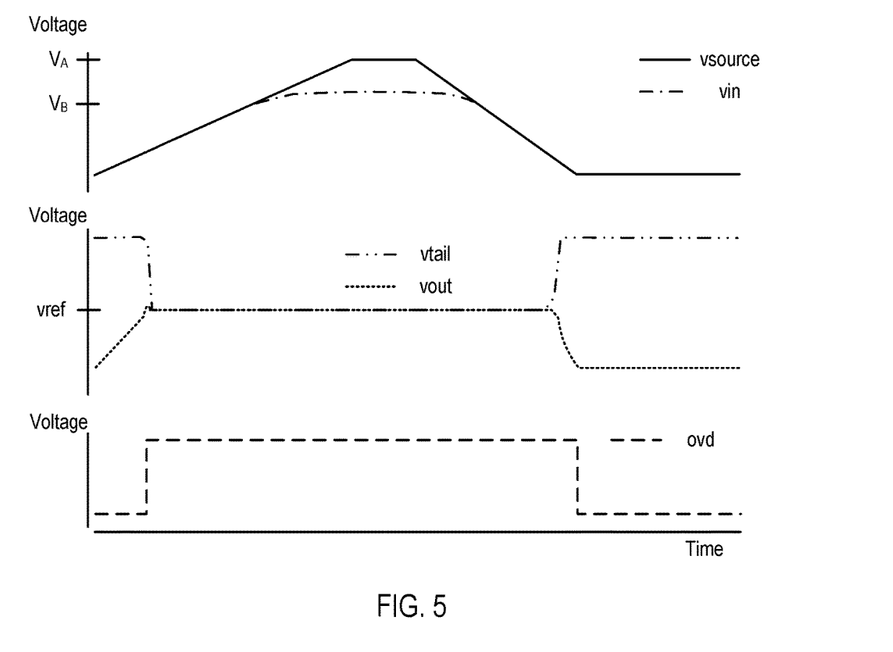
FIG. 5 illustrates the behavior of various nodes in the input buffer of FIG. 4 during an overvoltage event according to an example.

FIG. 5 illustrates the behavior of various nodes in the input buffer 400 during an overvoltage event according to an example. As shown, the external input voltage across the input impedance 312 (referred to in FIG. 5 as source) rises to a voltage $V_A$ (e.g., 3.3 V). The ESD circuit 310 clamps the voltage vsource to $V_B$ (e.g., 2.8 V), which is the voltage vin to the input buffer 400. The voltage vout starts rising up to vref (e.g., 1.15 V). When the voltage vout reaches vref, the overvoltage protection circuit turns on and starts modulating the internal currents of the buffer circuits 402. This current modulation forces the voltage vtail to fall down to the vout level and both settle at vref. This is an optimum level to guarantee reliability of the transistors A1, A2, and A4, as well as thin-oxide devices in the ADC circuits. The signal OVD is active from the instant vout is clamped to vref until the overvoltage event terminates. After the overvoltage event terminates, the voltages vtail and vout return to normal operation.

Figure 6:
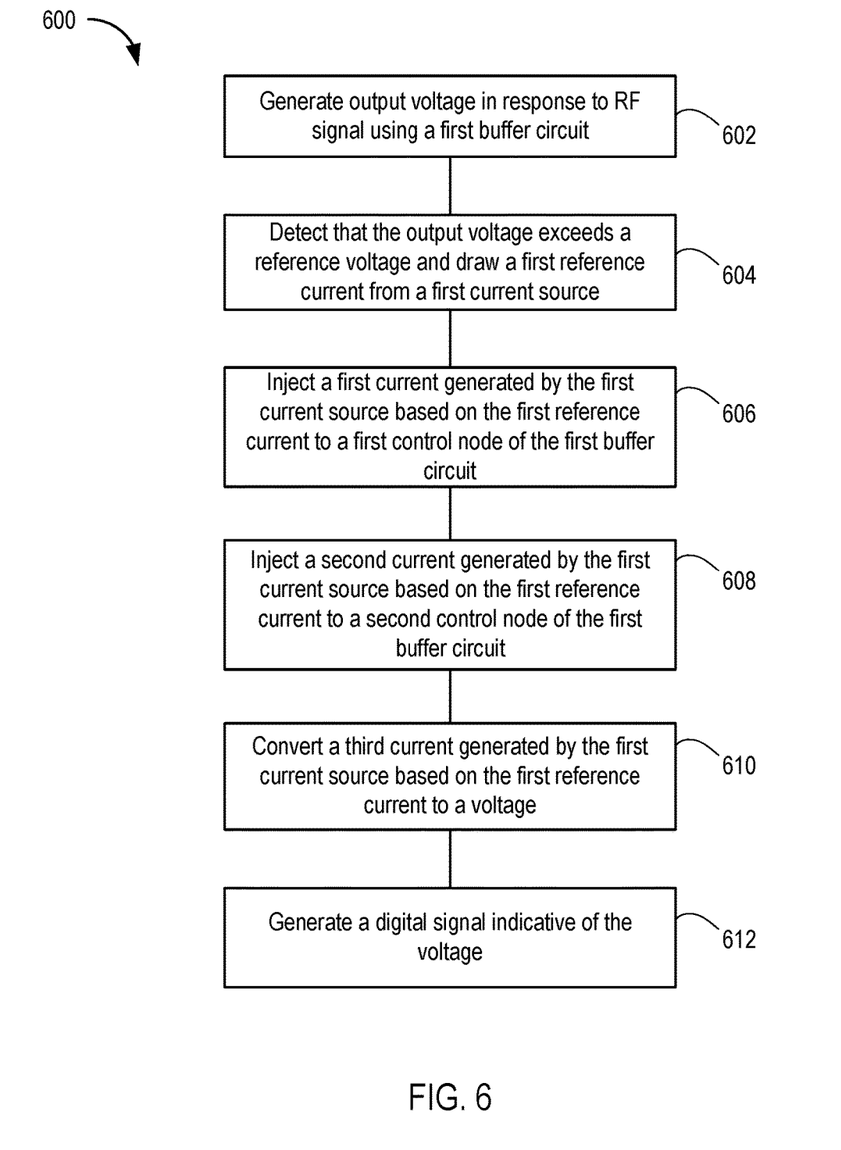
FIG. 6 is a flow diagram depicting a method of buffering an RF signal according to an example.

FIG. 6 is a flow diagram depicting a method 600 of buffering an RF signal according to an example. The method 600 includes a block 602, where the first buffer circuit 402 generates an output voltage (vout) in response to the RF signal. At block 604, a first transistor (D8) detects that the output voltage exceeds a reference voltage (vref), and a first current source 414 supplies a reference current. At block 606, the first current source 414 injects a first current (IC2) based on the reference current (Iref2) to a first control node (vctrl1) of the first buffer circuit 402. At block 608, the first current source 414 injects a second current (IC1) based on the reference current (Iref2) to a second control node (vctrl2) of the first buffer circuit 402. At block 610, a resistor (RD) converts a third current (ID10) into a voltage and the voltage comparator 408 generates a digital signal indicative of the voltage across the resistor (RD). Note that the blocks in the method 600 occur concurrently as the circuit operates and are not meant to indicate a specific sequence of steps.

Figure 7:
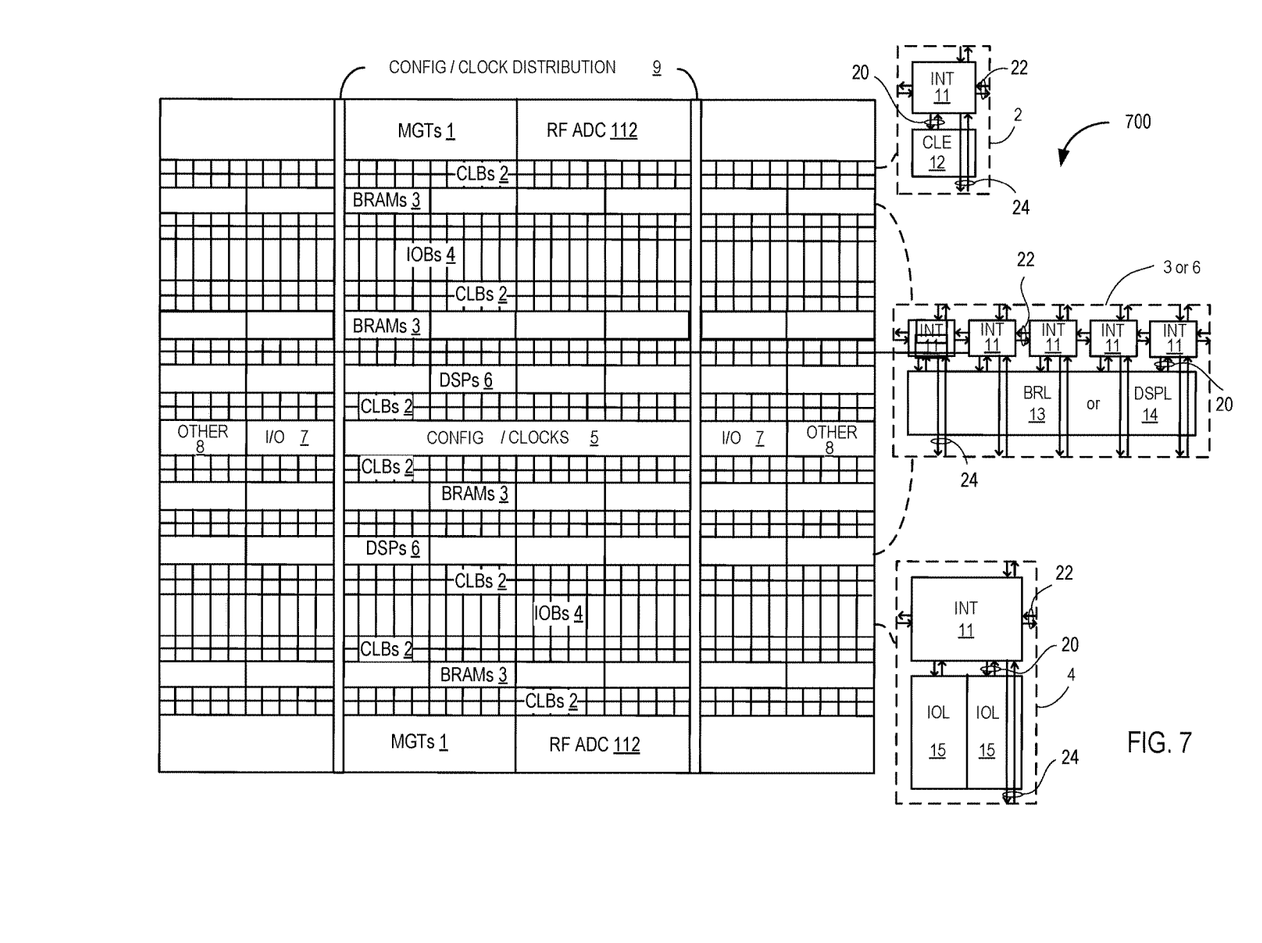
FIG. 7 illustrates an architecture of a field programmable gate array (FPGA) in which overvoltage protection circuitry described herein can be used according to an example.

FIG. 7 illustrates an architecture of a field programmable gate array (FPGA) 700 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-todigital converters, system monitoring logic, and so forth. Some FPGAs also include dedicated processing system (not shown).

In some FPGAs, each programmable tile can include at least one programmable interconnect element ("INT") 11 having connections to input and output terminals 20 of a programmable logic element within the same tile, as shown by examples included at the top of FIG. 7. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 7) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. A processing system in the FPGA 600 (not shown) can include various components ranging from a single microprocessor to a complete programmable processing system of microprocessor(s), memory controllers, peripherals, and the like.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

The FPGA 600 can include an RF ADC 112 having input circuitry 300 configured as shown in FIG. 3 and an input buffer 400 with overvoltage protection circuitry as shown in FIG. 4.

While the foregoing is directed to specific examples, other and further examples may be devised without departing from the basic scope thereof, and the scope thereof is determined by the claims that follow.

What is claimed is:

1. An input buffer, comprising:
   first buffer circuit having an output, a first voltage control node, and a second voltage control node;
   a first transistor having a gate coupled to the output of the first buffer circuit, a drain, and a source;
   a second buffer circuit having an input coupled to a reference voltage and an output coupled to the source of the first transistor; and
   a first current source having a reference output coupled to the drain of the first transistor, a first output coupled to the first voltage control node of the first buffer circuit, and a second output coupled to the second voltage control node of the first buffer circuit.

2. The input buffer of claim 1, wherein the first current source includes a third output, and wherein the input buffer further comprises:
   a resistor coupled between electrical ground and the third output of the first current source; and
   a voltage comparator having an input coupled to a node formed by the third output of the first current source and the resistor.

3. The input buffer of claim 1, wherein the reference output of the first current source supplies a first reference current, the first output of the first current source supplies a first mirrored current, and the second output of the first current source supplies a second mirrored current, each of the first and second mirrored current being proportional to the first reference current.

4. The input buffer of claim 3, wherein the first buffer circuit comprises:
   a second transistor having a gate providing an input to the first buffer circuit, a source, and a drain;
   a second current source having a reference output coupled to a third current source, a first output coupled to the drain of the second transistor, and a second output; and
   a fourth current source having a reference input coupled to the second output of the second current source and an input coupled to the source of the second transistor;
   wherein the reference output of the second current source is common with the first voltage control node and the second output of the second current source is common with the second voltage control node.

5. The input buffer of claim 4, wherein second current source includes a thin-oxide transistor providing the first output, and wherein the fourth current source comprises a plurality of thin-oxide transistors.

6. The input buffer of claim 5, wherein the first transistor comprises a thick-oxide transistor, and wherein the second current source includes thick-oxide transistors providing the reference output and the second output, respectively.

7. The input buffer of claim 6, wherein each thick-oxide transistor has a higher maximum voltage across pairs of its terminals than each thin-oxide transistor.

8. The input buffer of claim 1, wherein the second buffer circuit comprises:

a second transistor having a gate coupled to receive the reference voltage, a source providing the output coupled to the source of the first transistor, and a drain;

a third transistor having a gate coupled to receive a first bias voltage, a source coupled to a supply node, and a drain;

a fourth transistor having a source coupled to the drain of the third transistor, a gate coupled to receive a second bias voltage, and a drain;

a third current source having a reference input coupled to the drain of the fourth transistor and an input coupled to the drain of the second transistor.

9. The input buffer of claim 8, wherein the third transistor comprises a thin-oxide transistor, and wherein the third current source includes a plurality of thin-oxide transistors.

10. An analog-to-digital converter (ADC), comprising:
ADC and control circuitry configured to sample an analog signal and generate a digital signal; and
an input buffer configured to receive a radio frequency (RF) signal and generate the analog signal, the input buffer including:
a first buffer circuit having an output, a first voltage control node, and a second voltage control node;
a first transistor having a gate coupled to the output of the first buffer circuit, a drain, and a source;
a second buffer circuit having an input coupled to a reference voltage and an output coupled to the source of the first transistor; and
a first current source having a reference output coupled to the drain of the first transistor, a first output coupled to the first voltage control node of the first buffer circuit, and a second output coupled to the second voltage control node of the first buffer circuit.

11. The ADC of claim 10, wherein the first current source includes a third output, and wherein the input buffer further comprises:
a resistor coupled between electrical ground and the third output of the first current source; and
a voltage comparator having an input coupled to a node formed by the third output of the first current source and the resistor.

12. The ADC of claim 10, wherein the reference output of the first current source supplies a first reference current, the first output of the first current source supplies a first mirrored current, and the second output of the first current source supplies a second mirrored current, each of the first and second mirrored current being proportional to the first reference current.

13. The ADC of claim 12, wherein the first buffer circuit comprises:
a second transistor having a gate providing an input to the first buffer circuit, a source, and a drain;
a second current source having a reference output coupled to a third current source, a first output coupled to the drain of the second transistor, and a second output; and a fourth current source having a reference input coupled to the second output of the second current source and an input coupled to the source of the second transistor;
wherein the reference output of the second current source is common with the first voltage control node and the second output of the second current source is common with the second voltage control node.

14. The ADC of claim 13, wherein second current source includes a thin-oxide transistor providing the first output, and wherein the fourth current source comprises a plurality of thin-oxide transistors.

15. The ADC of claim 14, wherein the first transistor comprises a thick-oxide transistor, and wherein the second current source includes thick-oxide transistors providing the reference output and the second output, respectively.

16. The ADC of claim 15, wherein each thick-oxide transistor has a higher maximum voltage across pairs of its terminals than each thin-oxide transistor.

17. The ADC of claim 10, wherein the second buffer circuit comprises:
a second transistor having a gate coupled to receive the reference voltage, a source providing the output coupled to the source of the first transistor, and a drain;
a third transistor having a gate coupled to receive a first bias voltage, a source coupled to a supply node, and a drain;
a fourth transistor having a source coupled to the drain of the third transistor, a gate coupled to receive a second bias voltage, and a drain;
a third current source having a reference input coupled to the drain of the fourth transistor and an input coupled to the drain of the second transistor.

18. The ADC of claim 17, wherein the third transistor comprises a thin-oxide transistor, and wherein the third current source includes a plurality of thin-oxide transistors.

19. A method of buffering a radio frequency (RF) signal, comprising:
generating, using a first buffer circuit, an output voltage in response to the RF signal;
detecting, using a first transistor coupled to receive the output voltage, that the output voltage exceeds a reference voltage and drawing a first reference current from a first current source;
injecting a first current generated by the first current source based on the first reference current to a first control node of the first buffer circuit; and
injecting a second current generated by the first current source based on the first reference current to a second control node of the first buffer circuit.

20. The method of claim 19, further comprising:
converting a third current generated by the first current source based on the first reference current to a voltage using a resistor; and
generating a digital signal indicative of the voltage across the resistor.

* * * * *